United States Patent
Chen

(10) Patent No.: US 12,052,905 B2
(45) Date of Patent: Jul. 30, 2024

(54) DISPLAY PANEL AND MOBILE TERMINAL

(71) Applicant: Shenzhen China Star Optoelectronics Semiconductor Display Technology Co., Ltd., Guangdong (CN)

(72) Inventor: Lixuan Chen, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 17/598,886

(22) PCT Filed: Aug. 9, 2021

(86) PCT No.: PCT/CN2021/111582
§ 371 (c)(1),
(2) Date: Sep. 28, 2021

(87) PCT Pub. No.: WO2023/004880
PCT Pub. Date: Feb. 2, 2023

(65) Prior Publication Data
US 2024/0049574 A1   Feb. 8, 2024

(30) Foreign Application Priority Data
Jul. 30, 2021 (CN) .......... 202110868035.7

(51) Int. Cl.
*H10K 59/35* (2023.01)
*H10K 59/80* (2023.01)

(52) U.S. Cl.
CPC ......... *H10K 59/876* (2023.02); *H10K 59/351* (2023.02)

(58) Field of Classification Search
CPC ............................ H10K 59/876; H10K 59/351
USPC ............................................................ 313/506
See application file for complete search history.

(56) References Cited

U.S. PATENT DOCUMENTS

2013/0140535 A1* 6/2013 Chu ...................... H10K 59/876
257/40
2018/0061896 A1* 3/2018 Cheng ..................... H10K 50/85

FOREIGN PATENT DOCUMENTS

| CN | 107845669 | 3/2018 |
|---|---|---|
| CN | 108389978 | 8/2018 |
| CN | 108448007 | 8/2018 |
| CN | 108493210 | 9/2018 |
| CN | 108574052 | 9/2018 |
| CN | 108695359 | 10/2018 |
| JP | 2010-140787 | 6/2010 |

* cited by examiner

Primary Examiner — Christopher M Raabe

(57) ABSTRACT

The present application provides a display panel and a mobile terminal, which can mix the same color light emitted by one of a plurality of light-emitting devices and another one of the plurality of light-emitting devices, thereby simultaneously improving light extraction efficiency and viewing angle characteristics of the display panel.

20 Claims, 9 Drawing Sheets

DISPLAY PANEL AND MOBILE TERMINAL

RELATED APPLICATIONS

This application is a National Phase of PCT Patent Application No. PCT/CN2021/111582 having International filing date of Aug. 9, 2021, which claims the benefit of priority of Chinese Patent Application No. 202110868035.7 filed on Jul. 30, 2021. The contents of the above applications are all incorporated by reference as if fully set forth herein in their entirety.

FIELD AND BACKGROUND OF THE INVENTION

The present application relates to a field of display technology, in particular to a display panel and a mobile terminal.

BACKGROUND OF INVENTION

Organic light-emitting diode (OLED) and quantum dot light-emitting diode (QLED) manufactured by inkjet printing technology have achieved small-scale commercialization in the mid-size field, but they also have some defects. For example, a brightness of OLED is low, and a stability of OLED is slightly worse than other displays. On the other hand, because of a microcavity effect in the red/green/blue (R/G/B) pixel light-emitting devices of OLED, inkjet-printed OLED devices are at risk of viewing angle color cast.

At present, when considering the microcavity effect, the condition of is constructive interference needs to be satisfied $2L\cos\theta=m\lambda$, wherein m is a positive integer, L represents a length of the microcavity, $\lambda$ represents a light wavelength of the color displayed by the light-emitting device, $\theta$ represents an angle between the user's line of sight and a normal direction of the light-emitting surface of the light-emitting device. It can be clearly seen from the above conditions that when $\theta$ deviates from 0 degrees to a large angle, the wavelength $\lambda$ that satisfies the above formula will be shortened. Therefore, a long wavelength of the resonance at a large angle will be shorter than a vertical direction, and the color cast will be caused. At the same time, on the other hand, it can be found that when m=1, the corresponding device resonant cavity length L is the shortest, when m≥2, the resonant cavity length L will increase significantly. Therefore, in the prior art, corresponding to the same wavelength, there are a plurality of device film thicknesses in the resonance enhancement of the light-emitting device, and these film thicknesses meet the requirements of higher vertical emission brightness and narrower emission peak, that is a device design of the first resonant cavity length and the second resonant cavity length. However, this cavity length combination will cause a new problem, that is, the brightness viewing angle attenuation of R/G brightness viewing angles are much slower than a brightness viewing angle attenuation of B brightness viewing angle, resulting in defects such as partial yellow of large viewing angles.

SUMMARY OF THE INVENTION

The embodiments of the present application provide a display panel and a mobile terminal, which are used to improve the problem of partial yellow of large viewing angles of the currently display panel.

In order to realize the above-mentioned functions, the technical solutions provided by the embodiments of the present application are as follows:

The preset application provides a display panel, including:

a plurality of pixel groups, wherein each of the pixel groups includes a plurality of light-emitting devices, and wherein each of the light-emitting devices includes a first electrode and a second electrode arranged oppositely, a microcavity formed between the first electrode and the second electrode, and an organic light-emitting layer disposed in the microcavity;

the plurality of light-emitting devices includes at least two light-emitting device groups configured to display different colors, wherein each of the light-emitting device groups includes at least two light-emitting devices, and wherein in each light-emitting device group, a length of the microcavity of each light-emitting device is equal to a resonant cavity length of a wavelength of light of a color displayed by the light-emitting device group; and wherein in a predetermined viewing angle direction, and in at least one of the light-emitting device groups, a resonant cavity length of the microcavity corresponding to one of the light-emitting devices is greater than a resonant cavity length of the microcavity corresponding to another one of the light-emitting devices.

In the display panel provided by one embodiment of the present application, the length of the microcavity of each light-emitting device and the wavelength of light of the color displayed by the light-emitting device group satisfy the following relationship:

$$L \equiv \frac{m\lambda}{2\COS(\theta)} \quad (1)$$

wherein m is a positive integer, L represents the length of the microcavity, $\lambda$ represents the wavelength of light of the color displayed by the light-emitting device, and $\theta$ represents an angle between the user's line of sight and a normal direction of the light-emitting surface of the light-emitting device; and wherein in at least one of the light-emitting device groups, and in one of the light-emitting devices, m=1, the length of the microcavity of the light-emitting device is a first resonant cavity length, and in another one of the light-emitting devices, m≥2, the length of the microcavity of the light-emitting device is a second resonant cavity length, and the second resonant cavity length is greater than the first resonant cavity length.

In the display panel provided by one embodiment of the present application, the plurality of light-emitting devices includes a first light-emitting device group configured to display a first color, a second light-emitting device group configured to display a second color, and a third light-emitting device group configured to display a third color, and wherein the third light-emitting device group includes at least two third light-emitting devices;

the first light-emitting device group includes at least two first light-emitting devices, wherein a length of a microcavity of one of the first light-emitting devices is a length of a first resonant cavity corresponding to a wavelength of light of the first color, a length of a microcavity of another one of the first light-emitting devices is a second resonant cavity length corresponding to the wavelength of light of the first color; and the second light-emitting device group includes at least two second light-emitting devices, wherein a length of a microcavity of one of the second light-emitting devices is a length of a first resonant cavity corresponding to the wavelength of light of the second color, a length of the microcavity of another one of the second light-emitting devices is a length of a second resonant cavity corresponding to the wavelength of light of the second color.

In the display panel provided by one embodiment of the present application, in the third light-emitting device group, a length of the microcavity of each third light-emitting device is a second resonant cavity length corresponding to the wavelength of light of the third color.

In the display panel provided by one embodiment of the present application, in the third light-emitting device group, a length of the microcavity of one of the third light-emitting devices is a first resonant cavity length corresponding to the wavelength of light of the third color, and a length of the microcavity of another one of the third light-emitting devices is a second resonant cavity length corresponding to the wavelength of light of the third color.

In the display panel provided by one embodiment of the present application, each of the pixel group includes at least two pixel units, and each of the pixel units includes a first light-emitting device, a second light-emitting device, and a third light-emitting device;

in two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color; the length of the microcavity of one of the second light-emitting devices is the first resonant cavity length corresponding to the wavelength of light of the second color, and the length of the microcavity of another one of the second light-emitting devices is the second resonant cavity length corresponding to the wavelength of light of the second color.

In the display panel provided by one embodiment of the present application, in two adjacent pixel units, the length of the microcavity of one of the third light-emitting devices is the first resonant cavity length corresponding to the wavelength of the light of the third color, and the length of the microcavity of another one of the third light-emitting devices is the second resonant cavity length corresponding to the wavelength of the light of the third color.

In the display panel provided by one embodiment of the present application, the pixel group includes four pixel units arranged in an array;

in any two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color, and the lengths of the microcavities of the two second light-emitting devices are equal; or the length of the microcavity of one of the second light-emitting devices is the first resonant cavity length corresponding to the wavelength of light of the second color, the length of the microcavity of another one of the second light-emitting devices is the second resonant cavity length corresponding to the wavelength of the light of the second color, and the lengths of the microcavities of the two first light-emitting devices are equal.

In the display panel provided by one embodiment of the present application, in one of the light-emitting device groups, a number of the light-emitting devices having the first resonant cavity length is equal to a number of the light-emitting devices having the second resonant cavity length.

In the display panel provided by one embodiment of the present application, the first color and the second color are any combination of green and red.

The preset application provides a mobile terminal, including:
 a terminal body and a display panel electrically connected to the terminal body, wherein the display panel includes:
 a plurality of pixel groups, wherein each of the pixel groups includes a plurality of light-emitting devices, and wherein each of the light-emitting devices includes a first electrode and a second electrode arranged oppositely, a microcavity formed between the first electrode and the second electrode, and an organic light-emitting layer disposed in the microcavity;
 the plurality of light-emitting devices includes at least two light-emitting device groups configured to display different colors, wherein each of the light-emitting device groups is includes at least two light-emitting devices, and wherein in each light-emitting device group, a length of the microcavity of each light-emitting device is equal to a resonant cavity length of a wavelength of light of a color displayed by the light-emitting device group; and
 wherein in a predetermined viewing angle direction, and in at least one of the light-emitting device groups, a resonant cavity length of the microcavity corresponding to one of the light-emitting devices is greater than a resonant cavity length of the microcavity corresponding to another one of the light-emitting devices.

The beneficial effects of the embodiments of this application:
 The embodiment of the present application provides a plurality of pixel groups, wherein each of the pixel groups includes a plurality of light-emitting devices, and wherein each of the light-emitting devices includes a first electrode and a second electrode arranged oppositely, a microcavity formed between the first electrode and the second electrode, and an organic light-emitting layer disposed in the microcavity; the plurality of light-emitting devices includes at least two light-emitting device groups configured to display different colors, wherein each of the light-emitting device groups includes at least two light-emitting devices, and wherein in each light-emitting device group, a length of the microcavity of each light-emitting device is equal to a resonant cavity length of a wavelength of light of a color displayed by the light-emitting device group; wherein in a predetermined viewing angle direction, and in at least one of the light-emitting device groups, a resonant cavity length of the microcavity corresponding to one of the light-emitting devices is greater than a resonant cavity length of the microcavity corresponding to another one of the light-emitting devices. Therefore, in one of the pixel groups, one of the light-emitting devices in at least one of the light-emitting device groups can emit light with relatively high light extraction efficiency, and another one of the light-emitting devices can emit light with relatively low light extraction efficiency but ensuring light with a sufficient viewing angle, wherein light emitted by one light-emitting device and light emitted by another light-emitting device that emit the same color can be mixed, so that the display panel can simultaneously improve light extraction efficiency and viewing angle characteristics.

BRIEF DESCRIPTION OF THE SEVERAL VIEWS OF THE DRAWINGS

The technical solutions and other beneficial effects of the present application will be made obvious by describing the specific embodiments of the present application in is detail below in conjunction with the accompanying figures.

DETAILED DESCRIPTION OF SPECIFIC EMBODIMENTS OF THE INVENTION

The present application provides a display panel and a mobile terminal. In order to make the purpose, technical solution, and effects of the present application clearer, the present application will be further described in detail below with reference to the accompanying figures and embodiments. It should be understood that the specific embodiments described here are only used to explain the present application, and are not used to limit the present application.

Organic light-emitting display devices (OLED) include red light-emitting devices, green light-emitting devices, and blue light-emitting devices. When viewing the screen of the OLED at different viewing angles, a color of the screen will change, that is, color cast occurs is caused by the microcavity effect in the light-emitting device.

In the prior art, a display panel usually adopts a method in combination wherein a length of a microcavity of one light-emitting device is a first resonant cavity length, and a length of the microcavity of another one of the light-emitting devices is a second resonant cavity length, which can avoid problems of the film thickness of the light-emitting layer is relatively thin, which can prevent a phenomenon that the display panel is prone to breakdown and foreign matter short-circuit due to a relative thin film thickness of the organic light-emitting layer in an actual display production, and the brightness efficiency of the display panel is also guaranteed.

Figure 1A:
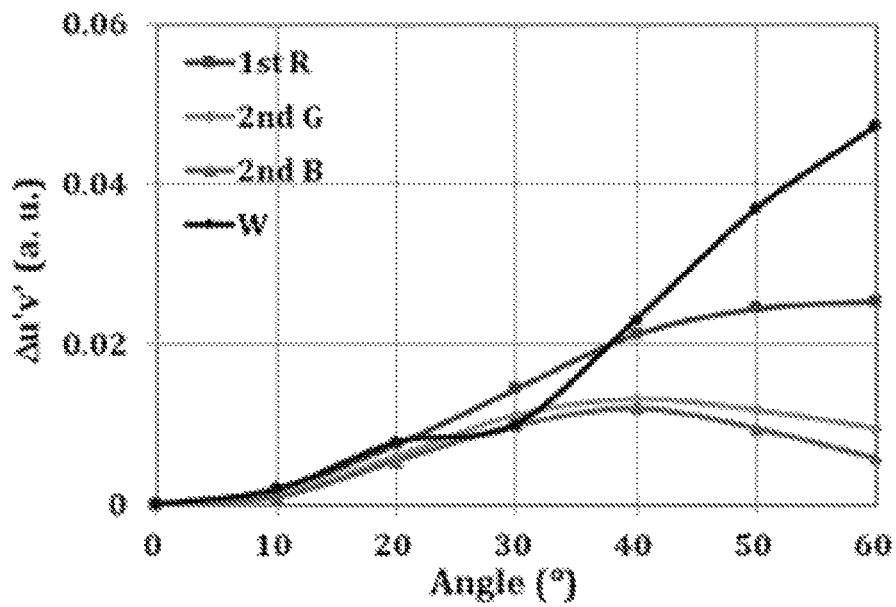
FIG. 1A is a schematic diagram of a curve of a color of light emitted by a light-emitting device changing with a viewing angle in the prior art.
Figure 1B:
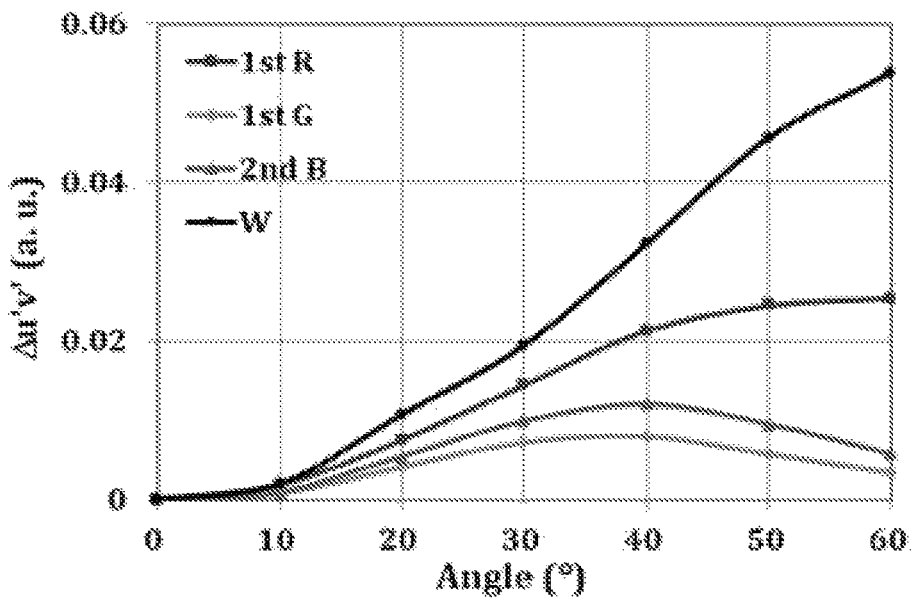
FIG. 1B is a schematic diagram of a curve of a color of light emitted by another light-emitting device changing with the viewing angle in the prior art.

However, please refer to FIGS. 1A and 1B, when a red-emitting light-emitting device and a green-emitting light-emitting device both adopt a design in which the length of the microcavity is the first resonant cavity length, when a blue light-emitting device adopts a design in which the length of the microcavity is the second resonant cavity length, attenuation amplitudes of the brightness viewing angle of the red light and the green light is significantly slower than an attenuation amplitude of the blue light, which causes the white light trajectory to be greatly shifted to the yellow light; When the red light-emitting device adopts the design in which the length of the microcavity is the first resonant cavity length, the green light-emitting device and the blue light-emitting device both adopt the length of the microcavity as In the design of the second resonant cavity length, because the brightness viewing angle of green and blue light decays too fast, the white light trajectory is greatly shifted to the red light, resulting in the display chromaticity/brightness viewing angle that does not meet the requirements. Based on the problem described above, embodiments of the present application provide a display panel to improve the above-mentioned defects.

Please refer to FIG. 2 to FIG. 10, embodiments of the present application provides a display panel, the display panel includes a plurality of pixel groups 100, wherein each of the pixel groups 100 includes a plurality of light-emitting devices 1000, and wherein each of the light-emitting devices 1000 includes a first electrode 10 and a second electrode 20 arranged oppositely, a microcavity formed between the first electrode 10 and the second electrode 20, and an organic light-emitting layer 30 provided in the microcavity.

The plurality of light-emitting devices 1000 include at least two light-emitting device groups 101 configured to display different colors, wherein each of the light-emitting device groups 101 includes at least two light-emitting devices 1000, and wherein in each light-emitting device group 101, a length of the microcavity of each light-emitting device 1000 is equal to a resonant cavity length of a wavelength of light of a color displayed by the light-emitting device group 101.

In a predetermined viewing angle direction, and in at least one of the light-emitting device groups 101, a resonant cavity length of the microcavity corresponding to one of the light-emitting devices 1000 is greater than a resonant cavity length of the microcavity corresponding to another one of the light-emitting devices 1000.

In one embodiment of the present application, a plurality of pixel groups 100 are provided, each of the pixel groups 100 includes a plurality of light-emitting devices 1000, and wherein each of the light-emitting devices 1000 includes at least two light-emitting device groups 101 configured to display different colors, wherein each of the light-emitting device groups 101 includes at least two light-emitting devices 1000, and wherein in each light-emitting device group 101, the length of the microcavity of each light-emitting device 1000 is equal to the resonant cavity length of the wavelength of light of the color displayed by the light-emitting device group 101. In the predetermined viewing angle direction, in at least one of the light-emitting device groups 101, the resonant cavity length of the microcavity corresponding to one of the light-emitting devices 1000 is greater than the resonant cavity length of the microcavity corresponding to another one of the light-emitting devices 1000. Thus, in one of the pixel groups 100, in at least one of the light-emitting device groups 101, one of the light-emitting devices 1000 can emit light with relatively high light extraction efficiency, and another one of light-emitting devices 1000 can emit light with relatively low light extraction efficiency but with sufficient viewing angle, and the light emitted by one light-emitting device 1000 and the light emitted by the another light-emitting device 1000 of the same color can be mixed, so that the display panel achieves a display effect of simultaneously improving light extraction efficiency and viewing angle characteristics.

The technical solution of the present application will now be described in conjunction with specific embodiments.

Figure 2:
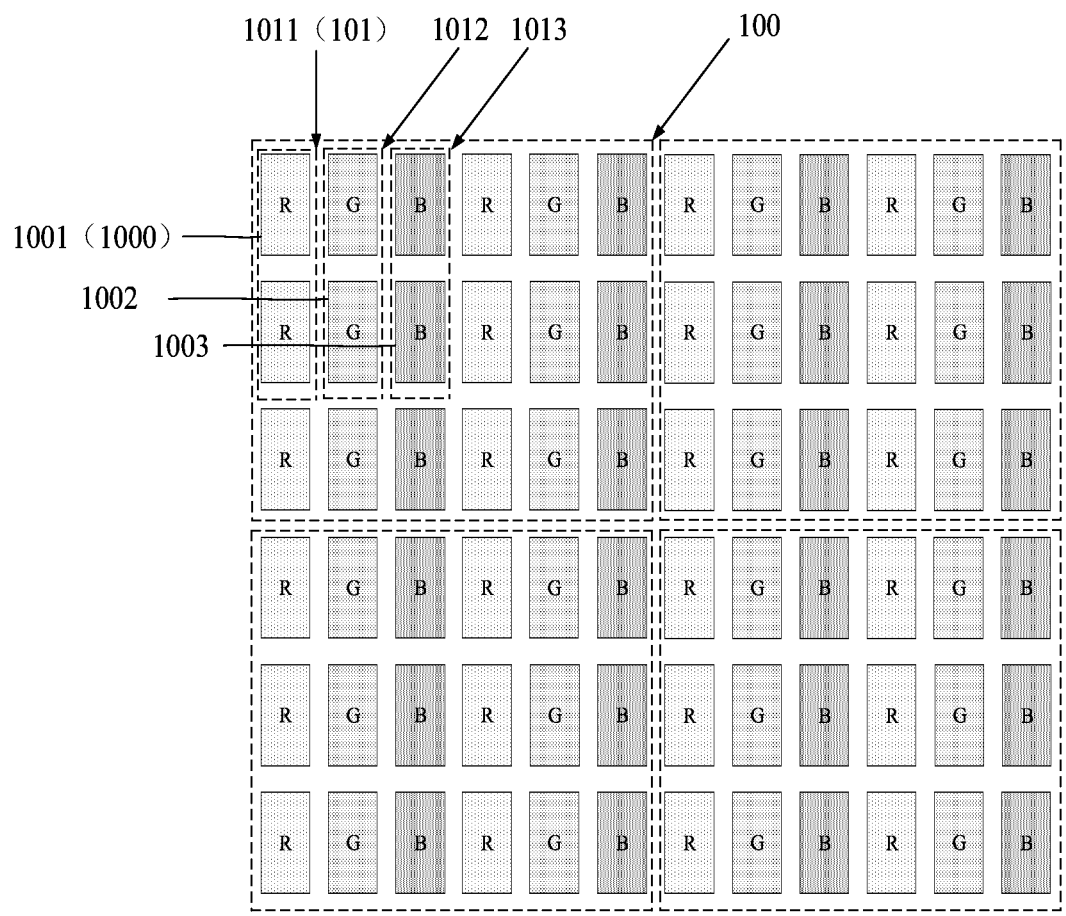
FIG. 2 is a first top view of a display panel provided by one embodiment of the present application.
Figure 3:
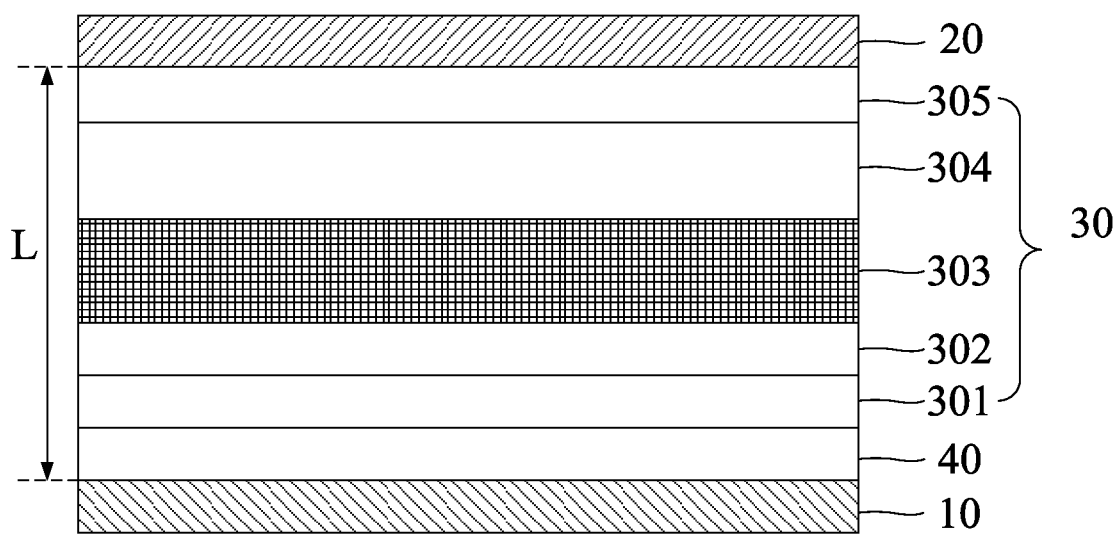
FIG. 3 is a schematic diagram of a first structure of a light-emitting device of the display panel provided by one embodiment of the present application.
Figure 4:
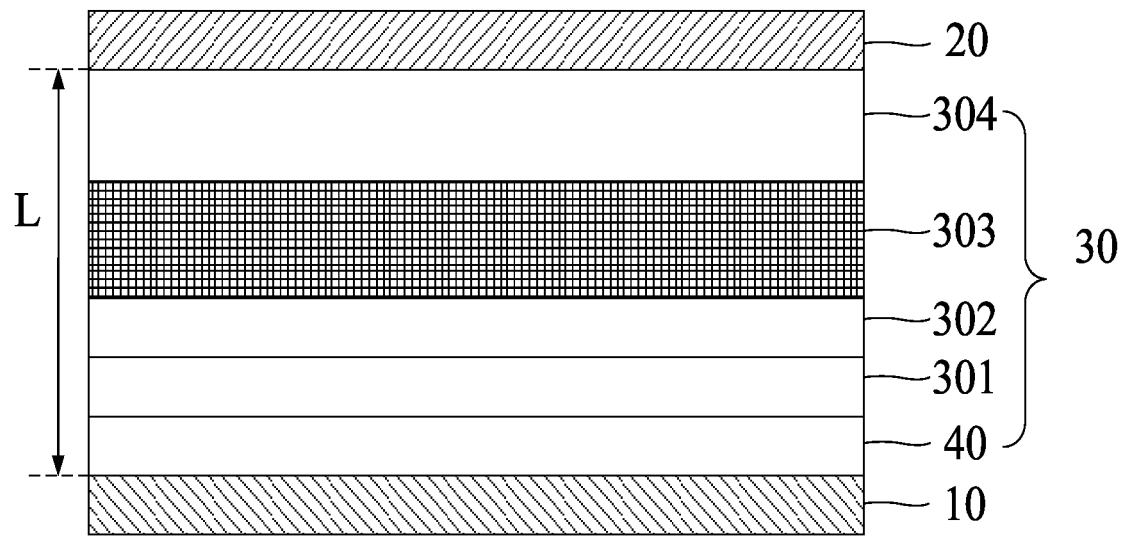
FIG. 4 is a schematic diagram of a second structure of the light-emitting device of the display panel provided by one embodiment of the present application.

Please refer to FIGS. 2 to 4, wherein FIG. 2 is a first top view of a display panel provided by one embodiment of the present application, FIG. 3 is a schematic diagram of a first structure of a light-emitting device of the display panel provided by one embodiment of the present application, and FIG. 4 is a schematic diagram of a second structure of the light-emitting device of the display panel provided by one embodiment of the present application.

This embodiment provides a display panel. The display panel includes a plurality of pixel groups 100. Each of the pixel groups 100 includes a plurality of light-emitting devices 1000, wherein each of the light-emitting devices 1000 includes a first electrode 10 and a second electrode 20, a microcavity formed between the first electrode and the second electrode 20, and an organic light-emitting layer 30 disposed in the microcavity, wherein a distance of the microcavity is L.

Specifically, in this embodiment, the first electrode 10 is a light reflective electrode, the light reflective electrode includes but is not limited to an anode, the second electrode 20 has reflective and semi-transmissive, and the second electrode 20 includes, but is not limited to a cathode. The microcavity is formed between the first electrode 10 and the second electrode 20, and the light emitted by the organic light-emitting layer 30 in the microcavity is reflected back and forth in the first electrode 10 and the second electrode 20, so that the light emitted by the organic light-emitting layer 30 increases through constructive interference. It should be noted that, in this embodiment, the light emitted by the organic light-emitting layer 30 includes but is not limited to red light, green light, and blue light.

It should be noted that the display panel includes, but is not limited to, organic light-emitting diode (OLED) and quantum dot light-emitting diodes (QLED). Further, in this embodiment, take organic light-emitting diodes as an example to describe the technical solutions of the present application.

In one embodiment, the organic light-emitting layer 30 includes a hole injection layer 301, a hole transport layer 302, a light-emitting layer 303, an electron buffer layer 304, and an electron transport layer 305 positioned between the first electrode 10 and the second electrode 20, wherein the hole injection layer 301 is in contact with the first electrode 10, and the electron transport layer 305 is in contact with the second electrode as shown in FIG. 3.

In one embodiment, the organic light-emitting layer 30 includes a hole injection layer 301, a hole transport layer 302, a light-emitting layer 303, and an electron buffer layer 304 positioned between the first electrode 10 and the second electrode 20, wherein the hole injection layer 301 is in contact with the first electrode 10, and the electron buffer layer 304 is in contact with the second electrode 20, as shown in FIG. 4.

It can be understood that this embodiment does not specifically limit the mechanism of the organic light-emitting layer 30. Further, in this embodiment, the organic light-emitting layer 30 includes the hole injection layer 301, the hole transport layer 302, the light-emitting layer 303, the electron buffer layer 304, and the electron transport layer 305 between the first electrode 10 and the second electrode 20 is taken as examples to describe the technical solution of the present application.

It should be noted that, in this embodiment, when the first electrode 10 is an anode, the light-emitting device 1000 further includes an auxiliary anode layer 40 positioned between the hole injection layer 301 and the first electrode 10. It is understandable that in this embodiment, the auxiliary anode layer 40 is provided between the first electrode 10 and the hole injection layer 301, thereby reducing a resistance in a direction of the first electrode 10 toward the second electrode 20 of the screen makes the screen display more uniform and improves the display effect.

In this embodiment, the plurality of light-emitting devices 1000 include at least two light-emitting device groups 101 configured to display different colors, wherein each of light-emitting device groups 101 includes at least two light-emitting devices 1000, and wherein in each light-emitting device group 101, a length of the microcavity of each light-emitting device 1000 is equal to a resonant cavity length of a wavelength of light of a color displayed by the light-emitting device group 101.

In a predetermined viewing angle direction, and in at least one of the light-emitting device groups 101, a resonant cavity length of the microcavity corresponding to one of the light-emitting devices 1000 is greater than a resonant of the microcavity corresponding to the other light-emitting device 1000. The resonant cavity of the cavity is long.

It should be noted that after the thickness of the first electrode 10 and the thickness of the second electrode 20 are determined, the cavity length of the microcavity between the first electrode 10 and the second electrode 20 has several fixed thicknesses, so that the light emitted by the light-emitting layer 303 can be effectively enhanced by interference, which is the so-called resonant cavity length of the light wavelength.

Specifically, the length of the microcavity of each light-emitting device 1000 and the light wavelength of light of the color displayed by the light-emitting device group 101 satisfy the following relationship:

$$L \equiv \frac{m\lambda}{2\cos(\theta)} \quad (1)$$

m is a positive integer, L represents the length of the microcavity, λ represents the wavelength of light of the color displayed by the light-emitting device 1000, and θ represents an angle between the user's line of sight and a normal direction of the light-emitting surface of the light-emitting device 1000.

In this embodiment, when m in the above formula (1) is approximately an integer, the light near the corresponding wavelength is enhanced, and as a result, the light is further enhanced relative to light of other wavelengths, and thus is released to the outside. It should be noted that in this embodiment, the predetermined viewing angle includes but not limited to 0°~180°, which is not specifically limited in this embodiment.

In this embodiment, in at least one of the light-emitting device groups 101, in one of the light-emitting devices 1000, m=1, a length of the microcavity of the light-emitting device 1000 is a first resonant cavity length, and in the light-emitting device 1000, m≥2, the length of the microcavity of the light-emitting device 1000 is a second resonant cavity length, and wherein the second resonant cavity length is greater than the first resonant cavity length.

Specifically, in this embodiment, the plurality of light-emitting devices 1000 include a first light-emitting device group 1011 configured to display a first color, a second light-emitting device group 1012 configured to display a second color, and a third light-emitting device group 1013 configured to display a third color, wherein the third light-emitting device group 1013 includes at least two third light-emitting devices 1003.

Figure 5:
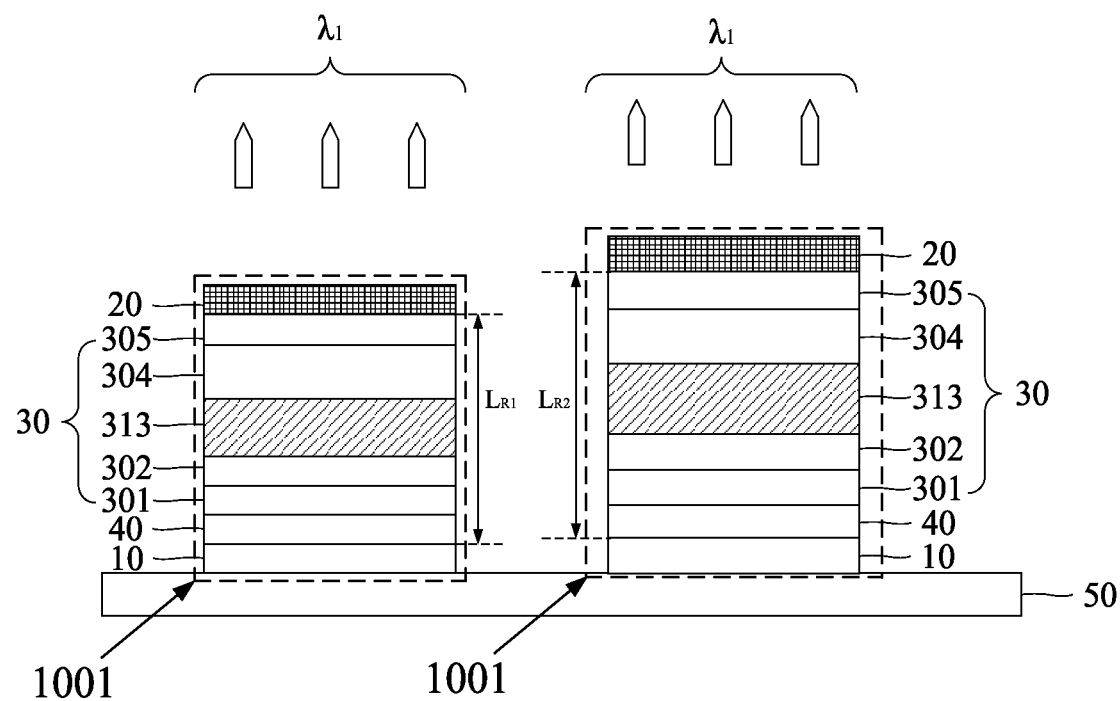
FIG. 5 is a schematic diagram of a structure of a first light-emitting device group of the display panel provided by one embodiment of the present application.

Please combine FIG. 2, FIG. 3 and FIG. 5, wherein FIG. 5 is a cross-sectional view of A-A portion of FIG. 2.

In this embodiment, the first light-emitting device group 1011 includes at least two first light-emitting devices 1001, and the first light-emitting device 1001 includes a first electrode 10, a hole injection device 301, a hole transport layer 302, a first light-emitting layer 313, an electron buffer layer 304, an electron transport layer 305, and ae second electrode 20 which are sequentially stacked on a substrate 50.

A length of a microcavity of one of the first light-emitting devices 1001 is a length of a first resonant cavity length $L_{R1}$ corresponding to a wavelength λ1 of light of the first color, a length of a microcavity of another one of the first light-emitting devices 1001 is a second resonant cavity length $L_{R2}$ corresponding to the wavelength λ1 of light of the first color, wherein the second resonant cavity length $L_{R2}$ is greater than the first resonant cavity length $L_{R1}$.

Figure 6:
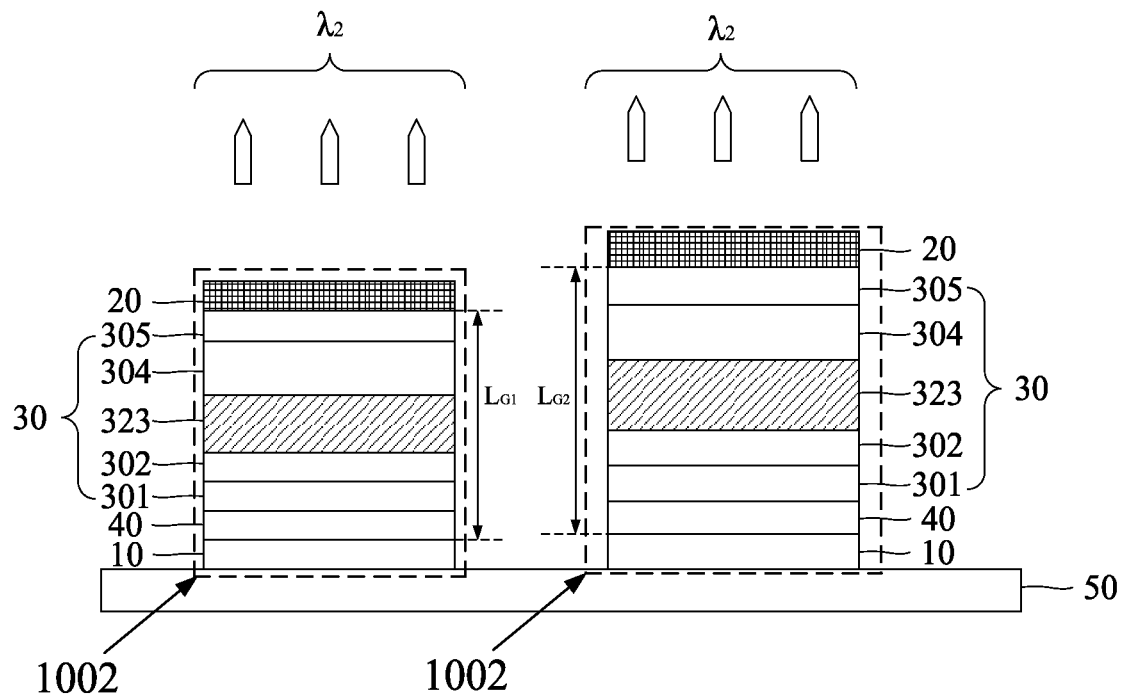
FIG. 6 is a schematic diagram of a structure of a second light-emitting device group of the display panel provided by one embodiment of the present application.

Please refer to FIG. 2, FIG. 3 and FIG. 6, wherein FIG. 6 is a cross-sectional view of B-B portion of FIG. 2.

In this embodiment, the second light-emitting device group 1012 includes at least two second light-emitting devices 1002, and the second light-emitting device 1002 includes a first electrode 10, a hole injection device layer 301, a hole transport layer 302, a second light-emitting layer 323, an electron buffer layer 304, an electron transport layer 305, and a second electrode 20 which are sequentially stacked on a substrate 50.

A length of a microcavity of one of the second light-emitting devices 1002 is a length of a first resonant cavity length $L_{G1}$ corresponding to a wavelength λ2 of light of the second color, a length of a microcavity of another one of the second light-emitting device 1002 is a second resonant cavity length $L_{G2}$ corresponding to the light wavelength λ2 of light of the second color, wherein the second resonant cavity length $L_{G2}$ is greater than the first resonant cavity length $L_{G1}$.

Figure 7A:
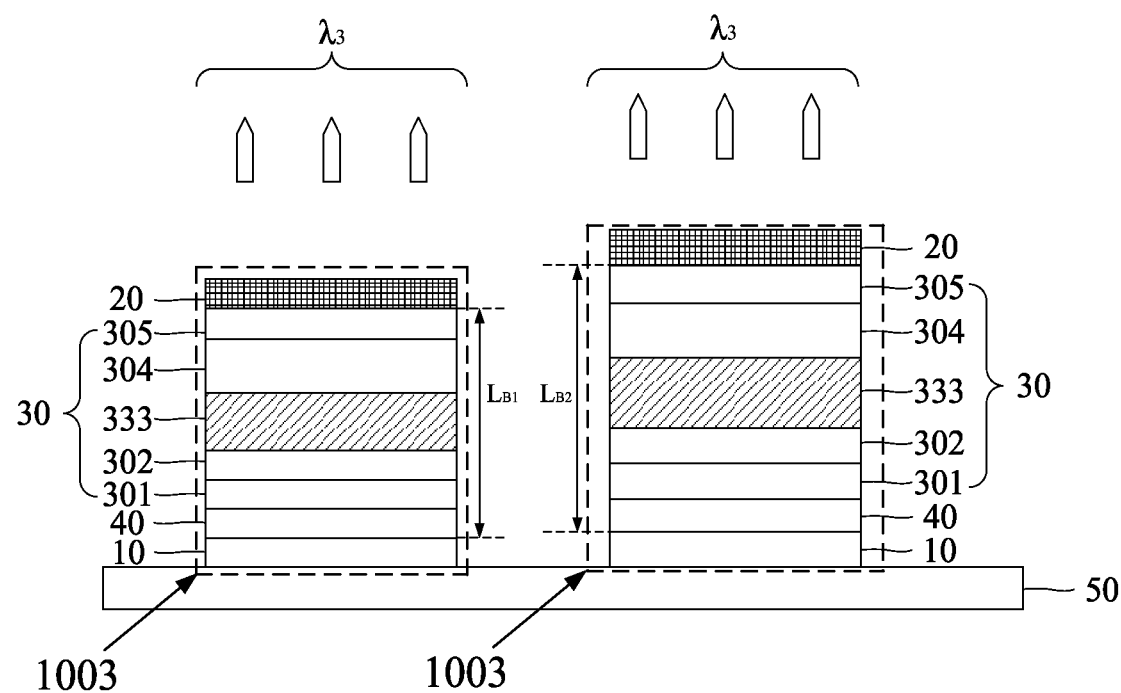
FIG. 7A is a schematic diagram of a structure of a third light-emitting device group of the display panel provided by one embodiment of the present application.

Please combine FIG. 2, FIG. 3, and FIG. 7A, wherein FIG. 7A is a first cross-sectional view of C-C portion of FIG. 2.

In this embodiment, the third light-emitting device 1003 includes a first electrode 10, a hole injection layer 301, a hole transport layer 302, a third light-emitting layer 333, an electron buffer layer 304, an electron transport layer 305, and a second electrode 20 which are sequentially stacked on the substrate 50.

A length of a microcavity of one of the third light-emitting devices 1003 is a length of a first resonant cavity $L_{B1}$ corresponding to a wavelength λ3 of light of the third color, a length of a microcavity of another one of the third light-emitting device 1003 is a length $L_{B2}$ of the second resonant cavity corresponding to the wavelength λ3 of light of the third color, wherein the second resonant cavity length $L_{B2}$ is greater than the first resonant cavity length $L_{B1}$.

It should be noted that the first color and the second color are any combination of green and red, and the third color is blue. Further, in this embodiment, the first color is red, and the second color is green as an example to describe the technical solution of the present application.

It is understandable that in this embodiment, the plurality of the pixel groups 100 are provided, wherein each of the pixel groups 100 includes a plurality of light-emitting devices 1000, and the plurality of light-emitting devices 1000 includes the first light-emitting device group 1011 configured to display the first color, the second light-emitting device group 1012 configured to display the second color, and the third light-emitting device group 1013 configured to display the third color, each of the first light-emitting device groups 101 includes at least two of the light-emitting devices 1000, wherein in the first light-emitting device group 1011, the length of the microcavity of one of the first light-emitting devices 1001 is the first resonant cavity length $L_{R1}$ corresponding to the wavelength $λ_1$ of light of the first color, and the length of the microcavity of the another is one of first light-emitting devices 1001 is the second resonant cavity length $L_{R2}$ corresponding to the light wavelength λ1 of the light of the first color. In the second light-emitting device group 1012, the length of the microcavity of one of the second light-emitting devices 1002 is the length $L_{G1}$ of the first resonant cavity corresponding to the wavelength λ2 of light of the second color, and the length of the microcavity of the another one of the second light-emitting devices 1002 is the length $L_{G2}$ of the second resonant cavity corresponding to the light wavelength λ2 of the second color. In the third light-emitting device group 1013, the length of the microcavity of one of the third light-emitting device 1003 is the length $L_{B1}$ of the first resonant cavity corresponding to the light wavelength λ3 of the third color, and the length of the microcavity of the another one of third light-emitting devices 1003 is the length $L_{B2}$ of the second resonance cavity corresponding to the light wavelength λ3 of the third color.

Therefore, in the light-emitting device group 101 displaying the same color, a peak wavelength of a spectrum of light to be emitted in one light-emitting device 1000 is similar to a peak wavelength of the spectrum of light to be emitted in the other light-emitting device 1000. Specifically, the light-emitting device 1000 whose length of the microcavity is the first resonant cavity length can improve light extraction efficiency, and the another light-emitting device 1000 whose length of the microcavity is the second resonant cavity length can ensure a sufficient viewing angle. Therefore, in one of the pixel groups 100, the light emitted by one of the light-emitting devices 1000 whose length of the microcavity is the first resonant cavity length and light emitted by another one of the light-emitting devices 1000 whose length of the microcavity is the second resonant cavity length can be mixed in the light-emitting device group 101 which displaying the same color, so as to obtain the effect of simultaneously improving both light extraction efficiency and viewing angle characteristics.

Figure 7B:
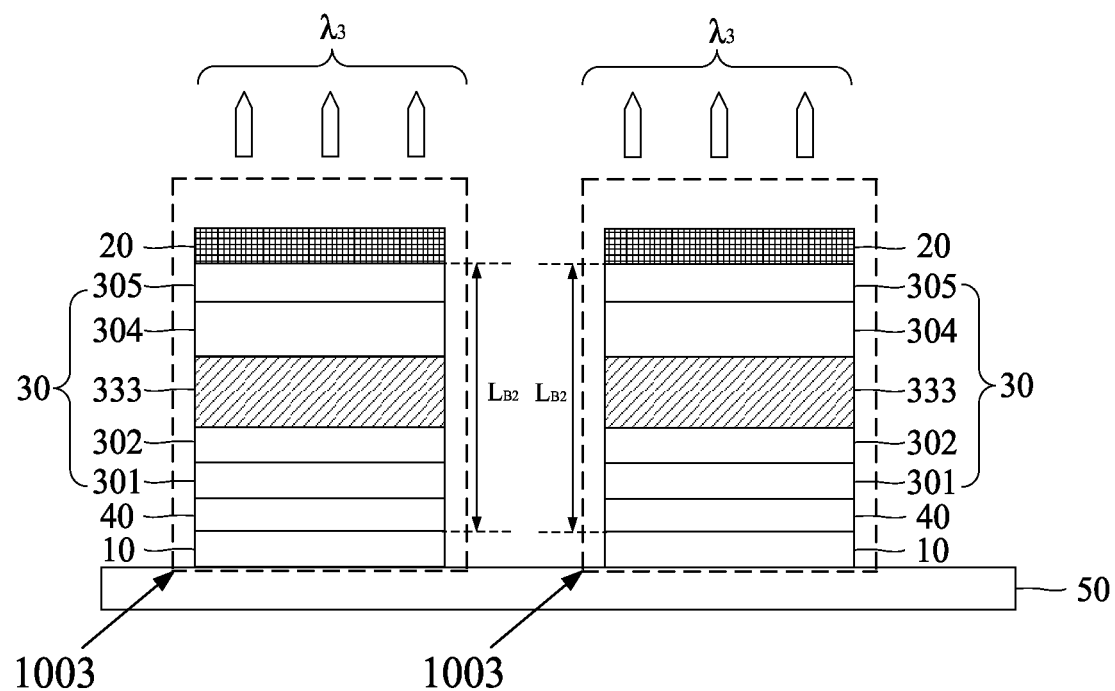
FIG. 7B is a schematic diagram of another structure of the third light-emitting device group of the display panel provided by one embodiment of the present application.

Please combine FIG. 2, FIG. 4, and FIG. 7B, wherein FIG. 7B is the second cross-sectional view of C-C portion of FIG. 2.

In this embodiment, the third light-emitting device 1003 includes a first electrode 10, a hole injection layer 301, a hole transport layer 302, a third light-emitting layer 333, an electron buffer layer 304, an electron transport layer 305, and a second electrode 20.

The length of the microcavity of each of the third light-emitting devices 1003 is the second resonant cavity length $L_{B2}$ corresponding to the wavelength of the light of the third color.

It is understandable that in this embodiment, the plurality of the pixel groups 100 are provided, wherein each of the pixel groups 100 includes a plurality of light-emitting devices 1000, and the plurality of light-emitting devices 1000 includes the first light-emitting device group 1011 configured to display the first color, the second light-emitting device group 1012 configured to display the second color, and the third light-emitting device group 1013 configured to display the third color, each of the first light-emitting device groups 101 includes at least two of the light-emitting devices 1000, wherein in the first light-emitting device group 1011, the length of the microcavity of one of the first light-emitting devices 1001 is the first resonant cavity length $L_{R1}$ corresponding to the wavelength $\lambda_1$ of light of the first color, and the length of the microcavity of the another one of first light-emitting devices 1001 is the second resonant cavity length $L_{R2}$ corresponding to the wavelength λ1 of light of the first color. In the second light-emitting device group 1012, the length of the microcavity of one of the second light-emitting devices 1002 is the first resonant cavity length $L_{G1}$ corresponding to the wavelength λ2 of light of the second color, and the length of the microcavity of the another one of the second light-emitting devices 1002 is the second resonant cavity length $L_{G2}$ corresponding to the light wavelength λ2 of the second color. In the third light-emitting device group 1013, the length of the microcavity of each of the third light-emitting device 1003 is the second resonance cavity length $L_{B2}$ corresponding to the wavelength λ3 of light of the third color.

Therefore, in the light-emitting device group 101 displaying the same color, a peak wavelength of a spectrum of light to be emitted in one light-emitting device 1000 is similar to a peak wavelength of the spectrum of light to be emitted in the other light-emitting device 1000. Specifically, the light-emitting device 1000 whose length of the microcavity is the first resonant cavity length can improve light extraction efficiency, and the another light-emitting device 1000 whose length of the microcavity is the second resonant cavity length can ensure a sufficient viewing angle. Therefore, in one of the pixel groups 100, the light emitted by one of the light-emitting devices 1000 whose length of the microcavity is the first resonant cavity length and light emitted by another one of the light-emitting devices 1000 whose the length of the microcavity is the second resonant cavity length can be mixed in the light-emitting device group 101 which displaying the same color, so as to obtain the effect of simultaneously improving both light extraction efficiency and viewing angle characteristics, at the same time, the length of the microcavity of each of the third light-emitting device 1003 is the second resonant cavity length corresponding to the wavelength of the light of the third color, which can prevent the third light-emitting device group 1013 from hidden dangers such as breakdown and short-circuit of foreign objects due to the length of the microcavity of each of the third light-emitting devices 1003 is too small.

It should be noted that, in this embodiment, in a light-emitting device group 101, a number of light-emitting devices 1000 having the first resonant cavity length is equal to a number of light-emitting devices 1000 having the second resonant cavity length.

In this embodiment, a plurality of the pixel groups 100 are provided, each of the pixel groups 100 includes a plurality of light-emitting devices 1000, and the plurality of light-emitting devices 1000 include the first light-emitting device group 1011 configured to display a first color, the second light-emitting device group 1012 configured to display the second color and the third light-emitting device group 1013 configured to display the third color, wherein in one of the light-emitting device groups 101, the number of light-emitting devices 1000 having the first resonant cavity length is equal to the number of light-emitting devices 1000 having the second resonant cavity length so that the light of different colors has a higher color purity, and the display effect is improved.

It is understandable that, in one of the light-emitting device groups 101, the number of light-emitting devices 1000 having the first resonant cavity length is equal to the number of light-emitting devices 1000 having the second resonant cavity length is for illustration only. The embodiment does not specifically limit this.

Figure 8:
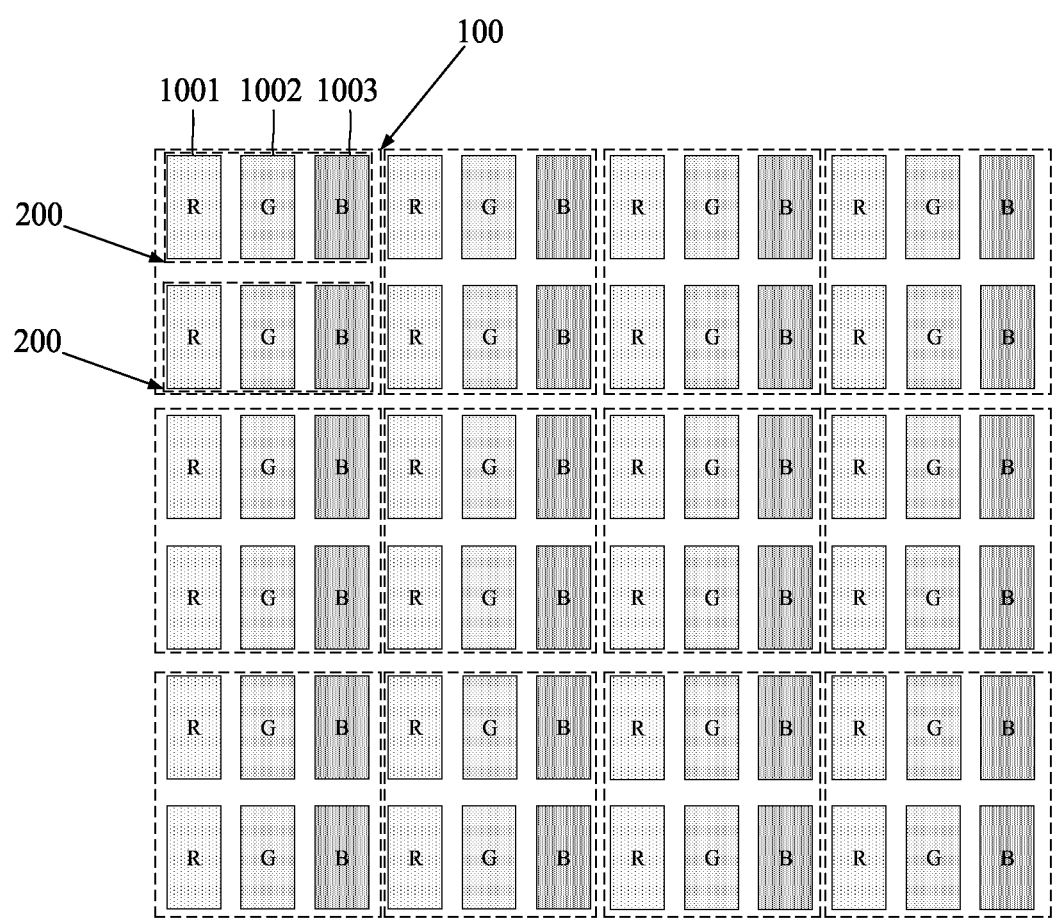
FIG. 8 is a second top view of the display panel provided by one embodiment of the present application.

Please refer to FIG. 5, FIG. 6, FIG. 7A, and FIG. 8. FIG. 8 is a second top view of the display panel provided by one embodiment of the present application.

In this embodiment, the pixel group 100 includes at least two pixel units 200, and each of pixel units 200 includes a first light-emitting device 1001, a second light-emitting device 1002, and a third light-emitting device 1003.

Specifically, in this embodiment, the pixel group 100 includes two pixel units 200, each of the pixel units 200 includes the first light-emitting device 1001 configured to display red, the second light-emitting device 1002 configured to display green, and the third light-emitting device 1003 configured to display blue.

In two adjacent pixel units 200, the length of the microcavity of one of the first light-emitting devices 1001 is the first resonant cavity length $L_{R1}$ corresponding to the wavelength $\lambda_1$ of light of the first color, and the length of the microcavity of the another one of first light-emitting devices 1001 is the second resonant cavity length $L_{R2}$ corresponding to the light wavelength λ1 of the light of the first color, the length of the microcavity of one of the second light-emitting devices 1002 is the length $L_{G1}$ of the first resonant cavity corresponding to the wavelength λ2 of light of the second color, and the length of the microcavity of the another one of the second light-emitting devices 1002 is the length $L_{G2}$ of the second resonant cavity corresponding to the light wavelength λ2 of the second color.

Further, in this embodiment, in two adjacent pixel units 200, a length of a microcavity of one of the third light-emitting devices 1003 is a length of a first resonant cavity $L_{B1}$ corresponding to a wavelength λ3 of light of the third color, a length of a microcavity of another one of the third light-emitting device 1003 is a second resonant cavity length $L_{B2}$ corresponding to the wavelength λ3 of light of the third color, so that in one of the pixel groups 100, the light emitted by one of the light-emitting devices 1000 which length of the microcavity is the first resonant cavity length and light emitted by another one of the light-emitting devices 1000 which length of the microcavity is the second resonant cavity length can be mixed in the light-emitting device group 101 which displaying the same color, so as to obtain the effect of simultaneously improving both light extraction efficiency and viewing angle characteristics.

It is understandable that in two adjacent pixel units 200, the length of the microcavity of one of the third light-emitting device 1003 is the first resonant cavity length $L_{B1}$ corresponding to the light wavelength λ3 of the third color, and the length of the microcavity of the another one of third light-emitting devices 1003 is the second resonance cavity length $L_{B2}$ corresponding to the light wavelength λ3 of the third color, which are only for illustration, this embodiment does not make specific restrictions.

Please refer to FIG. 5, FIG. 6, FIG. 7B, and FIG. 8, in one embodiment, in two adjacent pixel units 200, the microcavity of each of the third light-emitting devices 1003 of the light-emitting device group 1013, the length of the microcavity of each of the third light-emitting devices 1003 is the second resonant cavity length LB2 corresponding to the light wavelength λ3 of the third color, which can prevent the third light-emitting device group 1013 from hidden dangers such as breakdown and short-circuit of foreign objects due to the length of the microcavity of each of the third light-emitting devices 1003 is too small.

Figure 9:
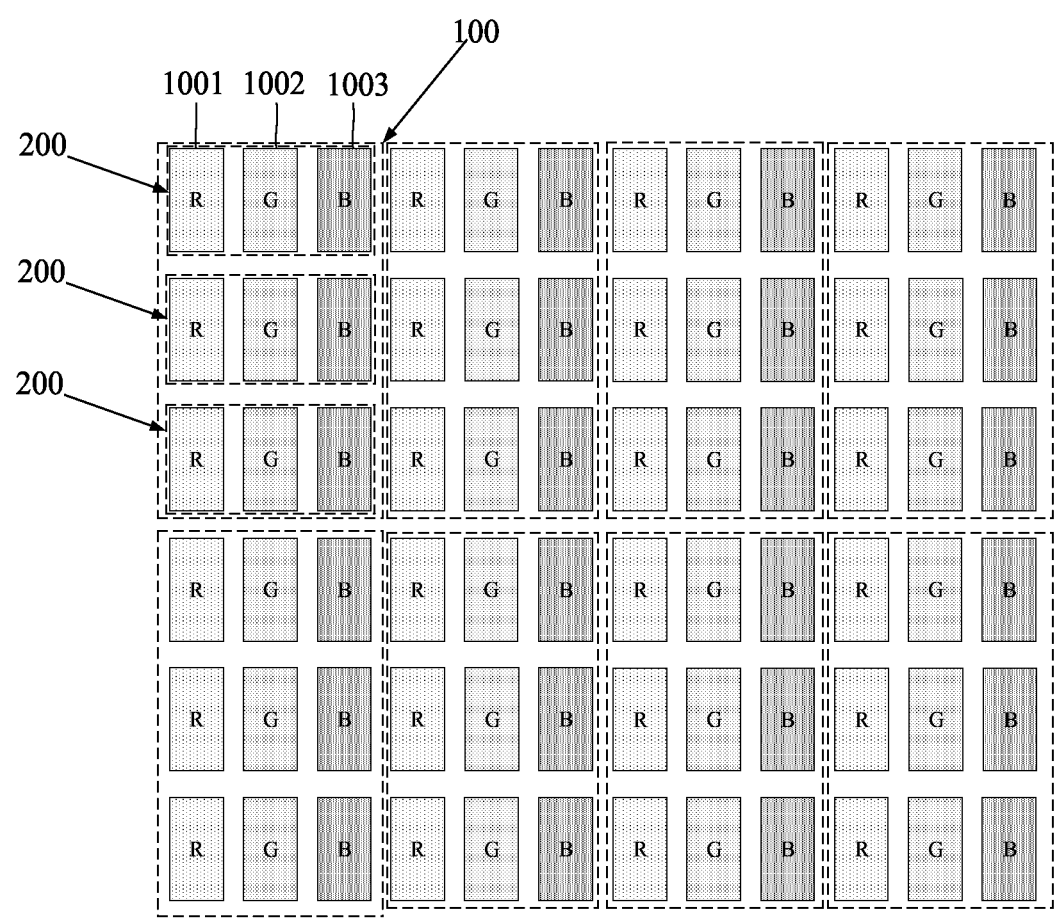
FIG. 9 is a third top view of the display panel provided by one embodiment of the present application.

Please combine FIG. 5, FIG. 6, FIG. 7B, and FIG. 9, wherein FIG. 9 is a third top view of the display panel provided by one embodiment of the present application.

In this embodiment, the pixel group 100 includes three pixel units 200, and each of pixel units 200 includes a first light-emitting device 1001 configured to display red, a second light-emitting device 1002 configured to display green, and a third light-emitting device 1003 configured to display blue.

In the three pixel units 200, the length of the microcavity of one of the first light-emitting devices 1001 is the first resonant cavity length $L_{R1}$ corresponding to the light wavelength λ1 of the first color, and the length of the microcavity of one of the other two of first light-emitting devices 1001 is the second resonant cavity length $L_{R2}$ corresponding to the light wavelength λ1 of the first color; the length of the microcavity of the second light-emitting device 1002 is the first resonant cavity length $L_{G1}$ corresponding to the wavelength λ2 of the light of the second color, and the length of the microcavity of one of the other two second light-emitting devices 1002 is the second resonant cavity length $L_{G2}$ corresponding to the wavelength λ2 of the light of the second color.

Further, in this embodiment, in two adjacent pixel units 200, the length of the microcavity in each of the third light-emitting devices 1003 is the second resonant cavity length $L_{B2}$ corresponding to the light wavelength λ3 of the third color, so that in one of the pixel groups 100, the light emitted by one of the light-emitting devices 1000 which length of the microcavity is the first resonant cavity length and light emitted by another one of the light-emitting devices 1000 which the length of the microcavity is the second resonant cavity length can be mixed in the light-emitting device group 101 which displaying the same color, so as to obtain the effect of simultaneously improving both light extraction efficiency and viewing angle characteristics, at the same time, prevent the third light-emitting device group 1013 from hidden dangers such as breakdown and short-circuit of foreign objects due to the length of the microcavity of each of the third light-emitting devices 1003 is too small.

Figure 10:
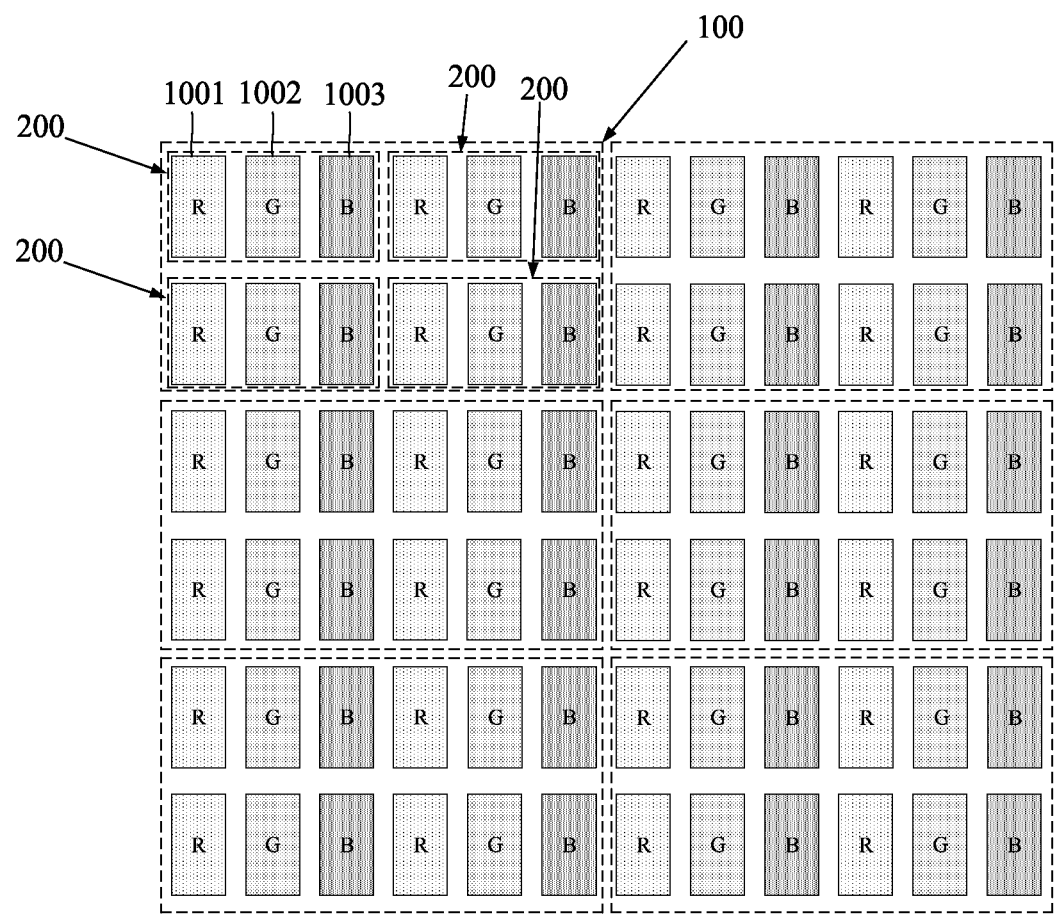
FIG. 10 is a fourth top view of a display panel provided by one embodiment of the present application.
Figure 11:
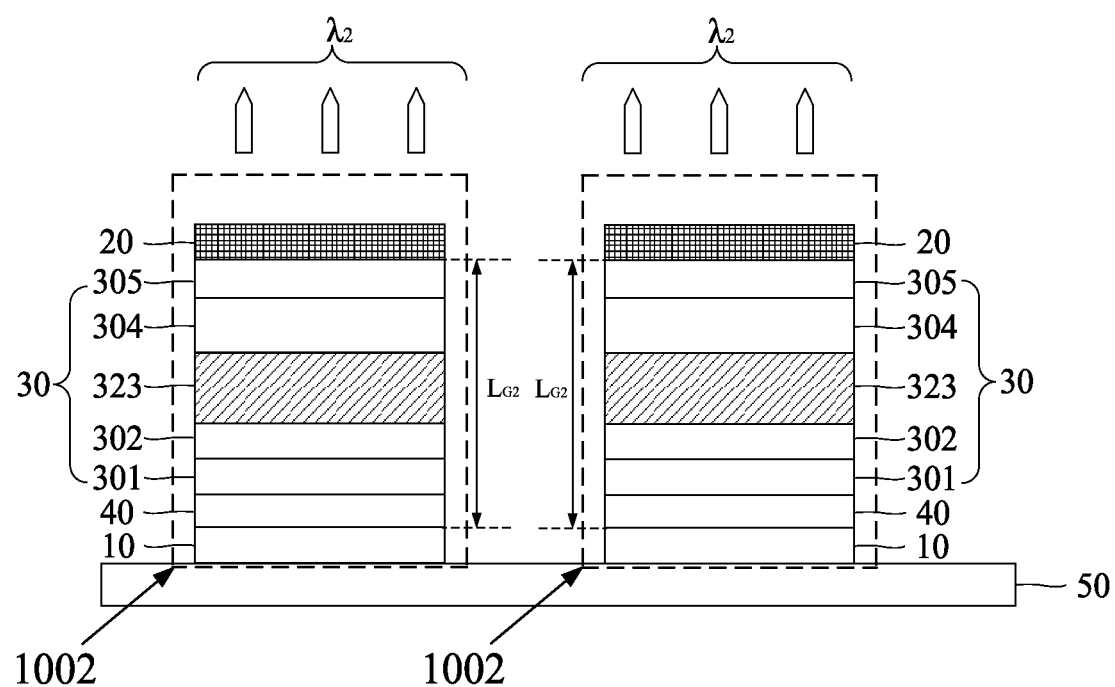
FIG. 11 is a schematic diagram of another structure of the second light-emitting device group of the display panel provided by one embodiment of the present application.

Please combine FIG. 5, FIG. 7B, FIG. 10, and FIG. 11, wherein FIG. 10 is a fourth top view of the display panel provided by one embodiment of the present application, and FIG. 11 is another structure diagram of the device group of the second light-emitting of is the display panel provided by the embodiment of the present application.

In this embodiment, the pixel group 100 includes four pixel units 200 arranged in an array; in any two adjacent pixel units 200, the length of microcavity of one of the first light-emitting devices 1001 is the first resonant cavity length $L_{R1}$ corresponding to the light wavelength λ1 of the first color, the length of the microcavity of another first light-emitting device 1001 is the second resonant cavity length $L_{R2}$ corresponding to the light wavelength λ1 of the first color, and the length of the microcavities of the two second light-emitting devices 1002 are equal; or the length of the microcavity of one of the second light-emitting devices 1002 is the first resonant cavity length $L_{G1}$ corresponding to the light wavelength λ2 of the second color, the length of the microcavity of another second light-emitting device 1002 is the length $L_{G2}$ corresponding to the wavelength λ2 of light of the second color, and the lengths of the microcavities of the two first light-emitting devices 1001 are the same.

Specifically, in this embodiment, in any two adjacent pixel units 200, the length of microcavity of one of the first light-emitting devices 1001 is the first resonant cavity length LR1 corresponding to the light wavelength λ1 of the first color, and the length of the microcavity of another first light-emitting device 1001 is the second resonant cavity length LR2 corresponding to the light wavelength λ1 of the first color, and the length of each of the microcavity of the second light emitting device 1002 is the second resonant cavity length LG2 corresponding to the wavelength λ2 of light of the second color, and at the same time, the microcavity of each of the third light-emitting devices 1003 of the light-emitting device group 1013, the length of the microcavity of each of the third light-emitting devices 1003 is the second resonant cavity length LB2 corresponding to the light wavelength λ3 of the third color, so that in one of the pixel groups 100, the light emitted by one of the light emitting devices 1000 which length of the microcavity is the first resonant cavity length and light emitted by another one of the light emitting devices 1000 which length of the microcavity is the second resonant cavity length can be mixed in the light emitting device group 101 which displaying the same color, so as to obtain the effect of simultaneously improving both light extraction efficiency and viewing angle characteristics; at the same time, the length of the microcavity of each of the third light-emitting device 1003 is the second resonant cavity length corresponding to the wavelength of the light of the third color, which can prevent the third light-emitting device group 1013 from hidden dangers such as breakdown and short-circuit of foreign objects due to the length of the microcavity of each of the third light-emitting devices 1003 is too small.

In summary, the present application proposes a display panel and a mobile terminal. The display panel includes a plurality of pixel groups 100. Each of the pixel groups 100 includes a plurality of light-emitting devices 1000, and wherein each of the light-emitting devices 1000 includes a first electrode 10 and a second electrode 20 arranged oppositely, a microcavity formed between the first electrode 10 and the second electrode 20, and an organic light-emitting layer 30 disposed in the microcavity; the plurality of light-emitting devices 1000 includes at least two light-emitting device groups 101 configured to display different colors, wherein each of the light-emitting device groups 101 includes at least two light-emitting devices 1000, and wherein in each light-emitting device group 101, a length of the microcavity of each light-emitting device 1000 is equal to a resonant cavity length of a wavelength of light of a color displayed by the light-emitting device group 101; wherein in a predetermined viewing angle direction, and in at least one of the light-emitting device groups 101, a resonant cavity length of the microcavity corresponding to one of the light-emitting devices 1000 is greater than a resonant cavity length of the microcavity corresponding to another one of the light-emitting devices 1000. Therefore, light emitted by one light-emitting device 1000 and light emitted by another light-emitting device 1000 that emit the same color can be mixed, so that the display panel can simultaneously improve light extraction efficiency and viewing angle characteristics.

In the above-mentioned embodiments, the description of each embodiment has its own emphasis. For parts that are not described in detail in an embodiment, reference may be made to related descriptions of other embodiments.

It can be understood that for those of ordinary skill in the art, equivalent substitutions or changes can be made according to the technical solutions of the present application and its inventive concept, and all these changes or substitutions shall fall within a protection scope of the appended claims of the present application.

What is claimed is:

1. A display panel comprising a plurality of pixel groups, wherein each of the pixel groups comprises a plurality of light-emitting devices, and wherein each of the light-emitting devices comprises a first electrode and a second electrode arranged oppositely, a microcavity formed between the first electrode and the second electrode, and an organic light-emitting layer disposed in the microcavity;
the plurality of light-emitting devices comprises at least two light-emitting device groups configured to display different colors, wherein each of the light-emitting device groups comprises at least two light-emitting devices, and wherein in each light-emitting device group, a length of the microcavity of each light-emitting device is equal to a resonant cavity length of a wavelength of light of a color displayed by the light-emitting device group; and
wherein in a predetermined viewing angle direction, and in at least one of the light-emitting device groups, a resonant cavity length of the microcavity corresponding to one of the light-emitting devices is greater than a resonant cavity length of the microcavity corresponding to another one of the light-emitting devices.

2. The display panel according to claim 1, wherein the length of the microcavity of each light-emitting device and the wavelength of light of the color displayed by the light-emitting device group satisfy the following relationship:

$$L \equiv \frac{m\lambda}{2\cos(\theta)} \quad (1)$$

wherein m is a positive integer, L represents the length of the microcavity, λ represents the wavelength of light of the color displayed by the light-emitting device, and θ represents an angle between the user's line of sight and a normal direction of the light-emitting surface of the light-emitting device; and
wherein in at least one of the light-emitting device groups, and in one of the light-emitting devices, m=1, the length of the microcavity of the light-emitting device is a first resonant cavity length, and in another one of the light-emitting devices, m≥2, the length of the microcavity of the light-emitting device is a second resonant cavity length, and the second resonant cavity length is greater than the first resonant cavity length.

3. The display panel according to claim 2, wherein the plurality of light-emitting devices comprises a first light-emitting device group configured to display a first color, a second light-emitting device group configured to display a second color, and a third light-emitting device group configured to display a third color, and wherein the third light-emitting device group comprises at least two third light-emitting devices;
the first light-emitting device group comprises at least two first light-emitting devices, wherein a length of a microcavity of one of the first light-emitting devices is a length of a first resonant cavity corresponding to a wavelength of light of the first color, a length of a microcavity of another one of the first light-emitting devices is a second resonant cavity length corresponding to the wavelength of light of the first color; and
the second light-emitting device group comprises at least two second light-emitting devices, wherein a length of a microcavity of one of the second light-emitting devices is a length of a first resonant cavity corresponding to the wavelength of light of the second color, a length of the microcavity of another one of the second light-emitting devices is a length of a second resonant cavity corresponding to the wavelength of light of the second color.

4. The display panel according to claim 3, wherein in the third light-emitting device group, a length of the microcavity of each third light-emitting device is a second resonant cavity length corresponding to the wavelength of light of the third color.

5. The display panel according to claim 3, wherein in the third light-emitting device group, a length of the microcavity of one of the third light-emitting devices is a first resonant cavity length corresponding to the wavelength of light of the third color, and a length of the microcavity of another one of the third light-emitting devices is a second resonant cavity length corresponding to the wavelength of light of the third color.

6. The display panel of claim 3, wherein each of the pixel group comprises at least two pixel units, and each of the pixel units comprises a first light-emitting device, a second light-emitting device, and a third light-emitting device;
in two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color; the length of the microcavity of one of the second light-emitting devices is the first resonant cavity length corresponding to the wavelength of light of the second color, and the length of the microcavity of another one of the second light-emitting devices is the second resonant cavity length corresponding to the wavelength of light of the second color.

7. The display panel according to claim 6, wherein in two adjacent pixel units, the length of the microcavity of one of the third light-emitting devices is the first resonant cavity length corresponding to the wavelength of the light of the third color, and the length of the microcavity of another one of the third light-emitting devices is the second resonant cavity length corresponding to the wavelength of the light of the third color.

8. The display panel according to claim 6, wherein the pixel group comprises four pixel units arranged in an array; in any two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color, and the lengths of the microcavities of the two second light-emitting devices are equal; or the length of the microcavity of one of the second light-emitting devices is the first resonant cavity length corresponding to the wavelength of light of the second color, the length of the microcavity of another one of the second light-emitting devices is the second resonant cavity length corresponding to the wavelength of the light of the second color, and the lengths of the microcavities of the two first light-emitting devices are equal.

9. The display panel according to claim 2, wherein in one of the light-emitting device groups, a number of the light-emitting devices having the first resonant cavity length is equal to a number of the light-emitting devices having the second resonant cavity length.

10. The display panel according to claim 3, wherein the first color and the second color are any combination of green and red.

11. A mobile terminal, comprising a terminal body and a display panel electrically connected to the terminal body, wherein the display panel comprises:
a plurality of pixel groups, wherein each of the pixel groups comprises a plurality of light-emitting devices, and wherein each of the light-emitting devices comprises a first electrode and a second electrode arranged oppositely, a microcavity formed between the first electrode and the second electrode, and an organic light-emitting layer disposed in the microcavity;
the plurality of light-emitting devices comprises at least two light-emitting device groups configured to display different colors, wherein each of the light-emitting device groups comprises at least two light-emitting devices, and wherein in each light-emitting device group, a length of the microcavity of each light-emitting device is equal to a resonant cavity length of a wavelength of light of a color displayed by the light-emitting device group; and
wherein in a predetermined viewing angle direction, and in at least one of the light-emitting device groups, a resonant cavity length of the microcavity corresponding to one of the light-emitting devices is greater than a resonant cavity length of the microcavity corresponding to another one of the light-emitting devices.

12. The mobile terminal according to claim 11, wherein the length of the microcavity of each light-emitting device and the wavelength of light of the color displayed by the light-emitting device group satisfy the following relationship:

$$L \equiv \frac{m\lambda}{2\cos(\theta)} \quad (1)$$

wherein m is a positive integer, L represents the length of the microcavity, $\lambda$ represents the wavelength of light of the color displayed by the light-emitting device, and $\theta$ represents an angle between the user's line of sight and a normal direction of the light-emitting surface of the light-emitting device; and
wherein in at least one of the light-emitting device groups, and in one of the light-emitting devices, m=1, the length of the microcavity of the light-emitting device is the first resonant cavity length, and in another one of the light-emitting devices, m≥2, the length of the microcavity of the light-emitting device is a second resonant cavity length, and the second resonant cavity length is greater than the first resonant cavity length.

13. The mobile terminal of claim 12, wherein the plurality of light-emitting devices comprises a first light-emitting device group configured to display a first color, a second light-emitting device group configured to display a second color, and a third light-emitting device group configured to display a third color, and wherein the third light-emitting device group comprises at least two third light-emitting devices;
the first light-emitting device group comprises at least two first light-emitting devices, wherein a length of a microcavity of one of the first light-emitting device is a length of a first resonant cavity corresponding to a wavelength of light of the first color, a length of a microcavity of another one of the first light-emitting device is a second resonant cavity length corresponding to the wavelength of light of the first color; and
the second light-emitting device group comprises at least two second light-emitting devices, wherein a length of a microcavity of one of the second light-emitting devices is a length of a first resonant cavity corresponding to the wavelength of light of the second color, a length of the microcavity of another one of the second light-emitting devices is a length of a second resonant cavity corresponding to the wavelength of light of the second color.

14. The mobile terminal according to claim 13, wherein in the third light-emitting device group, a length of the microcavity of each third light-emitting device is a second resonant cavity length corresponding to the wavelength of light of the third color.

15. The mobile terminal according to claim 13, wherein in the third light-emitting device group, a length of the microcavity of one of the third light-emitting devices is a first resonant cavity length corresponding to the wavelength of light of the third color, and a length of the microcavity of another one of the third light-emitting devices is a second resonant cavity length corresponding to the wavelength of light of the third color.

16. The mobile terminal according to claim 13, wherein each of the pixel group comprises at least two pixel units, and each of the pixel units comprises a first light-emitting device, a second light-emitting device, and a third light-emitting device;
in two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color; the length of the microcavity of one of the second light-emitting devices is the first resonant cavity length corresponding to the wavelength of light of the second color, and the length of the microcavity of another one of the second light-emitting devices is the second resonant cavity length corresponding to the wavelength of light of the second color.

17. The mobile terminal according to claim 16, wherein in two adjacent pixel units, the length of the microcavity of one of the third light-emitting devices is the first resonant cavity length corresponding to the wavelength of the light of the third color, and the length of the microcavity of another one of the third light-emitting device is the second resonant cavity length corresponding to the wavelength of the light of the third color.

18. The mobile terminal according to claim 16, wherein the pixel group comprises four pixel units arranged in an array;
in any two adjacent pixel units, the length of the microcavity of one of the first light-emitting devices is the first resonant cavity length corresponding to the wavelength of light of the first color, the length of the microcavity of another one of the first light-emitting devices is the second resonant cavity length corresponding to the wavelength of light of the first color, and the lengths of the microcavities of the two second light-emitting devices are equal; or the length of the microcavity of one of the second light-emitting devices is the first resonant cavity length corresponding to the wavelength of light of the second color, the length of the microcavity of another one of the second light-emitting devices is the second resonant cavity length corresponding to the wavelength of the light of the second color, and the lengths of the microcavities of the two first light-emitting devices are equal.

19. The mobile terminal according to claim 12, wherein in one of the light-emitting device groups, the number of the light-emitting devices having the first resonant cavity length is equal to the number of the light-emitting devices having the second resonant cavity length.

20. The mobile terminal according to claim 13, wherein the first color and the second color are any combination of green and red.

* * * * *